United States Patent
Jochmann et al.

(10) Patent No.: US 6,276,592 B1
(45) Date of Patent: Aug. 21, 2001

(54) PROCESS FOR THE PRODUCTION OF A HOLDING DEVICE FOR SEMICONDUCTOR DISKS AND HOLDING DEVICE PRODUCED BY THIS PROCESS

(75) Inventors: Peter Jochmann, Jena (DE); Walter Nadrag, Bad Bleiberg (AT); Klaus Sivec, Villach (AT); Edith Zimmermann, Graitschen (DE)

(73) Assignee: Sico Jena GmbH Quarzschmelze, Jena (DE)

( * ) Notice: Subject to any disclaimer, the term of this patent is extended or adjusted under 35 U.S.C. 154(b) by 0 days.

(21) Appl. No.: 09/451,177

(22) Filed: Nov. 30, 1999

(30) Foreign Application Priority Data

Nov. 30, 1998 (DE) ............................................ 198 56 468

(51) Int. Cl.$^7$ .................................................. B23K 31/02
(52) U.S. Cl. ........................ 228/121; 228/123.1; 228/182
(58) Field of Search ................................ 228/121, 122.1, 228/124.1, 195, 123.1, 182; 269/47, 55; 420/556

(56) References Cited

U.S. PATENT DOCUMENTS

| | | |
|---|---|---|
| 3,834,349 | 9/1974 | Dietze et al. . |
| 4,703,884 | * 11/1987 | Landingham et al. . |
| 4,784,313 | * 11/1988 | Godziemba-Maliszewsk . |
| 5,139,594 | * 8/1992 | Rabin . |
| 5,236,548 | * 8/1993 | Stadler et al. . |
| 5,372,298 | * 12/1994 | Glaeser . |
| 5,447,683 | * 9/1995 | Montgomery et al. . |
| 5,458,688 | 10/1995 | Watanabe . |
| 5,836,505 | * 11/1998 | Chaumat et al. . |

FOREIGN PATENT DOCUMENTS

| | | |
|---|---|---|
| 2025611 | 12/1970 | (DE) . |
| 2133877 | 1/1973 | (DE) . |
| 2349512 | 4/1975 | (DE) . |
| 3419866 | 11/1985 | (DE) . |
| 39 07 301 A1 | 9/1990 | (DE) . |
| 3907301 | 9/1990 | (DE) . |
| 0144998 | 6/1985 | (EP) . |
| 0793260 | 9/1997 | (EP) . |
| 0884769 | 12/1998 | (EP) . |
| 59-130419 | 7/1984 | (JP) . |
| 59-167015 | 9/1984 | (JP) . |
| 06 151 571 | 5/1994 | (JP) . |
| 08 102 446 | 4/1996 | (JP) . |
| 08 316 158 | 11/1996 | (JP) . |
| 08316158 | 11/1996 | (JP) . |

OTHER PUBLICATIONS

European Patent Office, Search Report, Feb. 25, 2000, 4 pages.

* cited by examiner

Primary Examiner—Tom Dunn
Assistant Examiner—Jonathan Johnson
(74) Attorney, Agent, or Firm—Reed Smith LLP

(57) ABSTRACT

A process for the production of a device is disclosed which is suitable for holding semiconductor disks (wafers) during diverse, preferably thermal, machining processes and for transporting semiconductor disks between different machining stations and which is formed of a plurality of individually pre-manufactured device parts that are assembled and connected with one another. The invention is further directed to a holding device for semiconductor disks which is manufactured by the production process according to the invention. In a process of the type described above, the device parts are first pre-manufactured separately and independent from one another from single-crystal or polycrystalline silicon and, in so doing, are provided with fitting surfaces which correspond to one another. The adjacent device parts with opposite fitting surfaces are then joined one inside or against the other and the fitting surfaces are connected with one another by diffusion welding and/or by soldering, wherein germanium powder is used as solder.

6 Claims, 3 Drawing Sheets

PROIR ART

PROCESS FOR THE PRODUCTION OF A HOLDING DEVICE FOR SEMICONDUCTOR DISKS AND HOLDING DEVICE PRODUCED BY THIS PROCESS

BACKGROUND OF THE INVENTION a) Field of the Invention

The invention is directed to a process for the production of a device which is suitable for holding semiconductor disks (wafers) during diverse, preferably thermal, machining processes and for transporting semiconductor disks between different machining stations and which is formed of a plurality of individually pre-manufactured device parts that are assembled and connected with one another. The invention is further directed to a holding device for semiconductor disks which is manufactured by the production process according to the invention.

The field of use of the invention is semiconductor technology, especially wafer machining and wafer handling. In this connection, a plurality of semiconductor disks or wafers which are oriented essentially with surfaces parallel with one another and from which, for example, integrated circuits are to be manufactured in subsequent production processes are held in a holding device (wafer boat) and subjected to individual machining steps in this holding device, wherein the semiconductor disks and the holding device are subjected to high thermal loads among others.

This is carried out in clean rooms within an atmosphere of high purity which is free of foreign substances for extensive prevention of uncontrolled and unwanted deposits of extraneous atoms or molecules in the wafer material.

b) Description of the Related Art

It is already known to produce a holding device of the type mentioned above for semiconductor disks made of quartz or sintered ceramic material by fusing or sintering individual device parts. This is described, for example, in DE 39 07 301 A1, page 1, lines 15 to 22.

Because of the expenses incurred in production, the required precision, the considerable outlay on repairs in case of breakage of materials, and so on, it is suggested in the above-cited reference to assemble the holding device by means of detachable connections of the individual device parts.

A holding device corresponding to the above-mentioned prior art is shown in FIG. 1. In this case, four holding elements 1 in the shape of round bars are provided at their side facing the semiconductor disks with notch-like or groove-shaped recesses 2 in which the semiconductor disks (not shown in the drawing) can be set in such a way that they are held at four areas of their outer circumference in vertical orientation parallel to one another at a distance required for the relevant machining step.

Further, two front or end parts 3 are provided with surfaces, for example, for setting up the holding device on a base. There are openings 4 at the front or end parts 3 for fastening the holding elements 1, wherein the positions of these openings 4 determine the spatial arrangement of the holding elements 1. The holding elements 1 have, at their ends on both sides, threads 5 which, together with nuts 6, serve for connecting with the front or end parts 3.

It is disadvantageous that connections of the type mentioned above do not satisfy requirements for stable, positionally accurate holding of semiconductor disks especially in the high temperature range, above all with respect to the considerable weight loading due to the often large number of semiconductor disks to be held. Further, while holding devices made of quartz do meet purity conditions, they are resistant to deformation only up to a temperature of 1057° C. and, in the case of holding devices made of sintered material, only up to 1250° C.

Further, holding devices are known in which the individual device parts are connected by welding or gluing as is described, for example, in JP 08 316 158 A. However, the requirements for purity and, when gluing, also the requirements for stability in the high temperature range cannot be met due to the introduction of extraneous material. Also, known constructions in which the device parts are connected by means of joining by driving fit or press fit, as is shown in reference JP 08 102 446 A, cannot satisfy requirements for use in the high temperature range.

In order to be able to satisfy the strict requirements for purity, it is proposed in the reference JP 06 151 571 A to produce a holding device for semiconductor disks from single-crystal silicon, wherein, however, the individual device parts are connected with one another so that they can be disassembled, i.e., detached again. The required prerequisites for strength and stability in the high temperature range can also not be achieved in this case.

In view of the disadvantages of the known prior art, it is the object of the invention to provide a process of the type mentioned above and a holding device for semiconductor disks that is produced by this process, wherein the purity requirements respecting the materials used for the device parts and for the connection of parts and also the mechanical stability of the parts connection are ensured up to temperatures of 1350° C.

According to the invention, in a process of the type described above, the device parts are first pre-manufactured individually from single-crystal or polycrystalline silicon and, in so doing, are provided with fitting surfaces which correspond to one another. The adjacent device parts with opposite fitting surfaces are then joined one inside or against the other and, finally, the fitting surfaces are connected with one another by diffusion welding and/or by soldering, wherein germanium powder is used as solder.

The process according to the invention makes it possible to produce a holding device for semiconductor disks which corresponds to the highest purity requirements at temperatures of up to 1350° C. in the clean room, i.e., release of contaminants above the level permissible for semiconductor technology is ruled out.

The invention makes it possible, first, to produce individual device parts economically, which is advantageous particularly in the case of parts with complicated geometry. During the subsequent joining process, the device parts are permanently connected with one another by material engagement, so that a high mechanical and thermal stability of the holding device is also ensured under high-temperature conditions. This is especially important in the range of temperatures up to 1350° C. and for the high weight loading due to the large number of semiconductor disks to be held.

The fitting surfaces are preferably constructed so as to be flat, but they can be curved in any desired manner; naturally, the fitting surfaces located opposite one another at different device parts must correspond or be adapted to one another with respect to curvature.

In an advantageous development of the invention, diffusion welding is carried out over a period of about three to four hours while the device parts are pressed against one another at a pressure of up to 10 N/mm$^2$ and at an ambient temperature of 1000° C. to 1300° C. The device parts are preferably surrounded by atmospheric air during the welding process.

For purposes of this connection, the device parts are prepared in such a way that the oppositely located fitting surfaces of two adjacent device parts contact one another, with respect to their curvature, along the entire area provided for welding. For example, the fitting surfaces can be constructed so as to be flat and parallel to one another or also with identical curvature so as to contact one another while forming a very small gap.

In a particularly preferred development of the invention, the soldering of the device parts is carried out in such a way that powdered germanium with a grain size of less than 50 $\mu$m is first introduced into a gap formed between the fitting surfaces of two device parts located opposite one another and the device parts are then connected with one another at a pressure of less than 30 mbar and at a temperature of 900° C. to 1350° C. The germanium acts as solder.

Instead of using germanium powder by itself, a mixture of germanium powder and high-purity water or a mixture of germanium powder and an organic oil, for example, pine oil, can be used. The addition of water or oil serves to fix the solder and improve its flowability. The additions disappear from the joint without residue during heating and have no negative influence on its strength.

Two device parts to be connected are placed opposite one another in preparation for soldering in such a way that a gap width in the range of magnitude of 0.1 mm to 0.5 mm remains between the fitting surfaces. The fitting surfaces can also be constructed so as to be flat and placed opposite one another at a distance within the above-mentioned range of 01 mm to 0.5 mm or the fitting surfaces can also be curved, wherein the curvatures at the two fitting surfaces are provided in such a way that the distance between the fitting surfaces of two device parts is not less than 0.1 mm and not greater than 0.5 mm.

The gap width can be constant along this entire surface region or a gap width can be provided between the two opposite fitting surfaces which varies within this range of 0.1 mm to 0.5 mm, which can apply to both flat and curved surfaces located opposite one another.

In a further development of the invention, flushing with argon is carried out during the soldering process. In this way, oxygen is kept away and germanium oxide formation which would negatively affect the strength of the joint is prevented.

In the development according to subclaim 2, the joint is formed of material of identical kinds or in the case of the arrangement from subclaim 3, material of different kinds, which is chemically similar to silicon and which does not permit any contamination and also satisfies requirements for stability. The proposed connection technique includes the possibility of repairing holding devices while retaining a high level of purity, which could not previously be realized with respect to defective parts. Formerly, remanufacture of at least individual parts was always necessary in the event of material breakage in devices of this type.

The invention is further directed to a holding device for semiconductor disks which is produced by the process steps mentioned above. The holding device is formed of individual device parts which are connected with one another by the process described above and between which the semiconductor disks are received so as to be oriented essentially with surfaces parallel with one another.

In particularly advantageous developments of the holding device, the device parts are outfitted with fitting surfaces which are located opposite one another from one device part to the next and which are fused together by diffusion welding according to the invention or between which germanium is introduced as solder, wherein two device parts are soldered together at their fitting surfaces.

In the following, the invention will be explained more fully with reference to embodiment examples.

BRIEF DESCRIPTION OF THE DRAWINGS

In the drawings:

FIG. 2 to FIG. 5 illustrate a first arrangement variant of the fitting surfaces.

DESCRIPTION OF THE PREFERRED EMBODIMENTS

Figure 1:
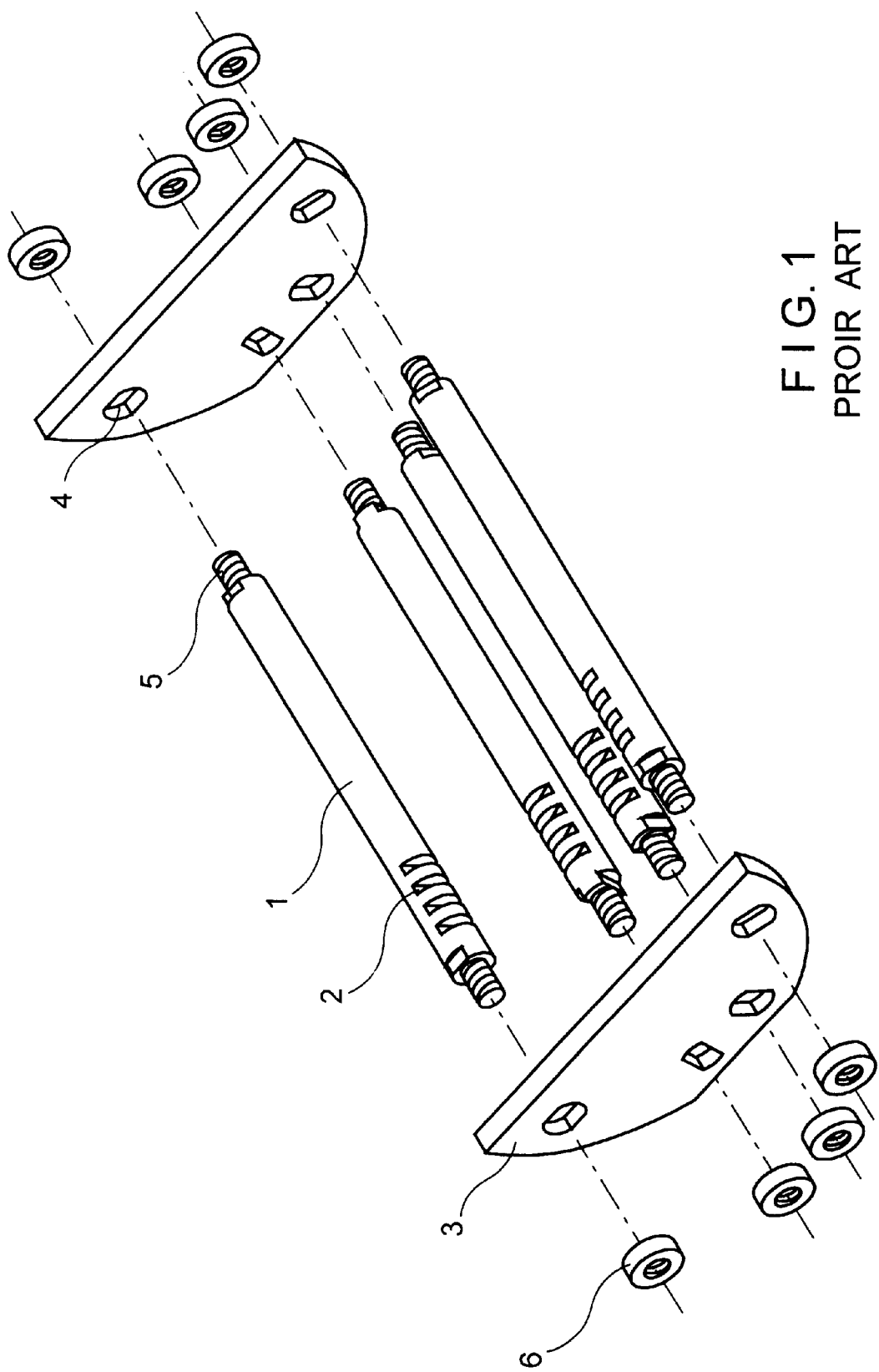
FIG. 1 is a holding device in accordance with the prior art.
Figure 2:
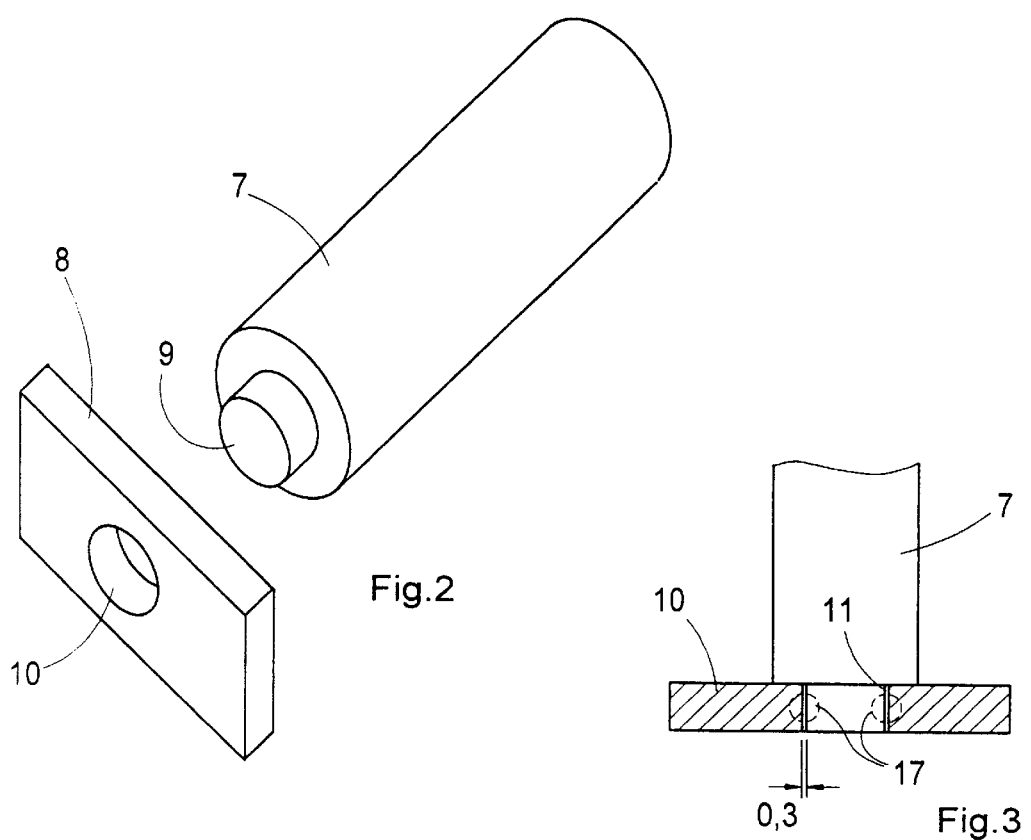

FIG. 2 shows a cylindrical holding part 7 which is provided for connection with an end part 8. The holding part 7 corresponds to the holding element 1 according to the prior art shown in FIG. 1. Like the holding element 1, holding part 7 also has recesses which serve to receive the semiconductor disks. However, the recesses are not shown again in the drawing because their construction basically corresponds to that shown in FIG. 1.

The holding part 7 has a cylindrical projection 9 which corresponds with a cutout 10 at the end part 8 with respect to shape and dimensions. The fitting surfaces located opposite one another at the projection 9 and cutout 10, i.e., the circumferential surface of the cylindrical projection 9 and the cylindrical inner surface of the cutout 10, are constructed in such a way that there is a gap width of 0.3 mm along the entire circumference (compare FIG. 3).

Figure 4:
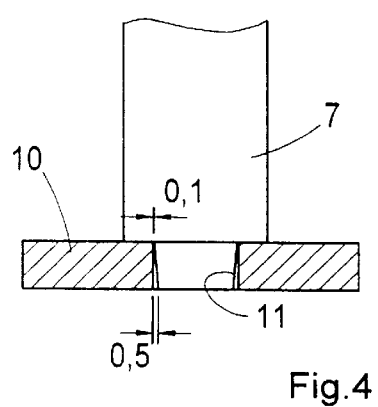

In a further construction variant according to FIG. 4, the width of the gap 11 is not uniform along the entire circumferential surface; rather the gap 11 (viewed from the holding part 7) has an increasing gap width, wherein the smallest gap width is 0.1 mm and the largest gap width is 0.5 mm.

Figure 5:
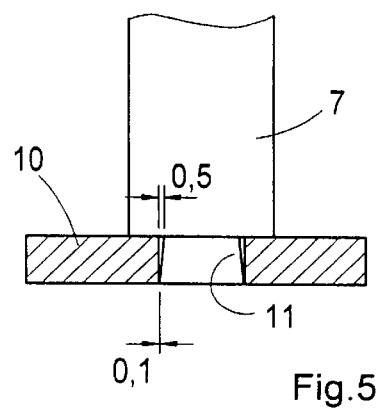

Conversely, according to FIG. 5, the maximum gap width of 0.5 mm can be formed close to the transition from the cylindrical projection 9 to the holding part 7, while the gap width decreases as the distance from the holding part 7 increases. The fitting surface at the holding part 7 and/or the fitting surface at the projection 9 can be inclined, i.e., it can extend at an angle other than 90° with respect to the respective base surface. In this connection, it is important only that both oppositely located fitting surfaces are inclined relative to one another.

Figure 8:
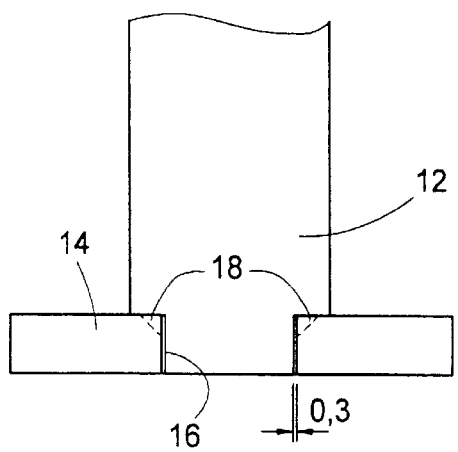

It can also be advantageous when grooves 17 and/or bevel-like inclinations 18 are incorporated in the fitting surfaces as is shown by way of example in FIG. 3 and FIG. 8. In this way, the distribution of the solder between the fitting surfaces can be improved with respect to function.

Figure 6:
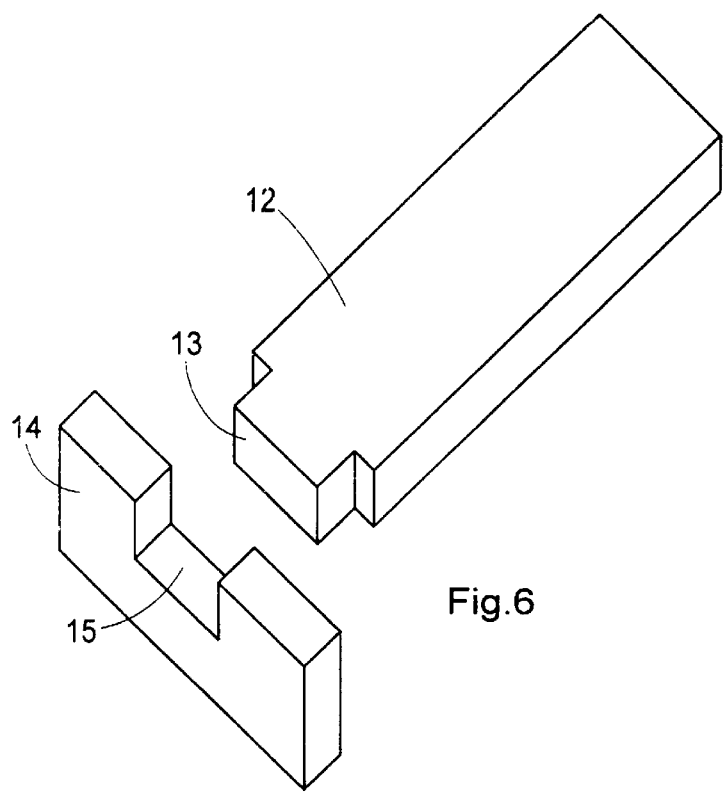
FIG. 6 to FIG. 9 illustrate a second arrangement variant of the fitting surfaces.

FIG. 6 shows a holding part 12 which has a rectangular cross section and which is provided with a square projection 13. Holding part 12 is provided for connecting with a device part 14 in which is incorporated a cutout 15 corresponding to the square projection 13 with respect to shape and size.

In this case also, a gap 16 remains between the outer surface of the square projection 13 and the inner surface of the cutout 15 when the holding part 12 is joined with the end part 14. As is shown in FIG. 4, the gap 16 has a uniform width of 0.3 mm along all surface portions located opposite to one another.

Figure 7:
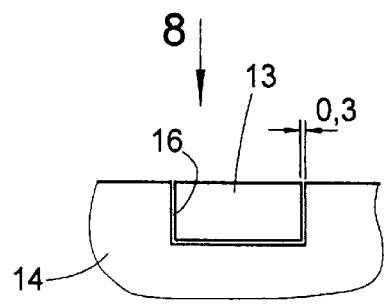

FIG. 8 shows this configuration in a view A with reference to FIG. 7. In this case, too, the constant gap width of the gap 16 can be seen.

Figure 9:
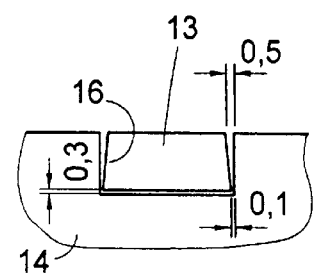

In FIG. 9, on the other hand, a variant of the invention is shown by way of example, wherein the gap width between the oppositely located surfaces is not constant. In this case, the gap width varies in the range from 0.1 mm to 0.5 mm.

Similar to the prior art shown in FIG. 1, the entire holding device for semiconductor disks comprises two plate-shaped or disk-shaped end carriers between which is located a plurality of holding elements or holding parts which are suitable for receiving a plurality of semiconductor disks such that their surfaces are substantially parallel with one another.

These holding elements can have cross-sectional shapes like those shown in FIG. 2 and FIG. 6, for example. Other possible embodiment forms of the holding elements are cylindrical jacket parts or portions which are adapted to the circular shape of the semiconductor disks to be received and which have groove-shaped recesses arranged in the interior for fixing the semiconductor disks.

The parts of the holding device mentioned above are manufactured from a single-crystal or polycrystalline silicon of the highest purity. The surfaces are mechanically machined, in some cases including surface polishing.

For the purpose of diffusion-welding of parts, these parts are first cleaned, fixed in the provided position and heated over a period of 2 to 4 hours under a contact pressing pressure of up to 10 N/mm$^2$ at a temperature of 1000° C. to 1300° C. In doing so, atoms of the parts material are diffused over the roughness peaks of the contacting parts surfaces to be joined, resulting in a stable material-engagement of the individual parts of the device.

The connection of the parts by soldering is carried out in the following manner: After thorough cleaning of the device parts, the latter are fixed in the provided position in such a way that a joint with a width of 0.1 to 0.5 mm remains between two fitting surfaces. Powdered germanium with a grain size of less than 50 μm is introduced into this joint. The device parts are then heated to a temperature of 900° C. to 1350° C. at a pressure of 30 mbar until all of the parts have reached this temperature.

The time period depends on the mass and dimensioning of the parts and is approximately 1.5 hours. After approaching the fusing temperature of the germanium (958.5° C.), the germanium in pasty or liquid state extensively fills the gaps 11, 16, if any, the grooves 17 and the cavities formed by bevels 18 and bonds at the fitting surfaces with the device parts. During the soldering process, flushing can be carried out with argon in order to keep off oxygen.

The invention is advantageously suitable for the production of a holding device for semiconductor disks of silicon in single-crystal or polycrystalline form, but is not limited thereto. When the holding element in particular is constructed in an appropriate manner, it is also possible for products other than semiconductor disks to be received.

By modifying the process according to the invention in an appropriate manner, it is possible to produce tubes, plates, frames or other types of parts and component assemblies assembled from a plurality of individually pre-manufactured part pieces comprising monocrystalline or polycrystalline silicon. As in the described procedure for producing a holding device for semiconductor disks, the individually pre-manufactured part pieces are to be provided with fitting surfaces which correspond to one another and which are located opposite one another during the joining process. The adjacent parts are connected with one another at the fitting surfaces by applying the process steps according to the invention in a manner similar to that described with respect to the holding device for semiconductor disks by diffusion welding or soldering.

Accordingly, tubes of monocrystalline or polycrystalline silicon, e.g., having an outer diameter of 200 mm with a wall thickness of 5 mm and a total length of at least 900 mm, can be advantageously produced. In the prior art, it is not possible for technical reasons pertaining to manufacturing to produce a silicon tube of the above-mentioned kind in a single piece. However, with the process according to the invention, three tube portions, each with a length of 300 mm, for example, can be joined to form the tube with a total length of 900 mm. Because of the undetachable material engagement of these three portions, there results a tube with the desired total length which is characterized by high mechanical and thermal stability and which is utilizable, in addition, under high-temperature conditions (up to about 1350° C.).

While the foregoing description and drawings represent the preferred embodiments of the present invention, it will be obvious to those skilled in the art that various changes and modifications may be made therein without departing from the true spirit and scope of the present invention.

What is claimed is:

1. A process for the production of a holding device for semiconductor disks in which a plurality of device parts are assembled and connected with one another to form the holding device, comprising the steps of:

first manufacturing the device parts individually from single-crystal or polycrystalline silicon and providing the parts with fitting surfaces which correspond with one another;

joining together the device parts which are adjacent to one another in the holding device by opposite fitting surfaces; and finally connecting the parts with one another at the fitting surfaces by at least one of diffusion welding and soldering, wherein germanium powder is used as solder wherein, for the purpose of the solder connection of two adjacent device parts, powdered germanium with a grain size of less than 50 μm and a layer thickness of 0.1 to 0.5 mm is first introduced between two respective fitting surfaces of these device parts and the parts are then connected with one another at the fitting surfaces under a pressure of less than 30 mbar and at an ambient temperature between 900° C. to 1350° C.

2. The process according to claim 1, wherein the diffusion welding is carried out during a period of two to four hours under a contact pressing pressure of up to 10 N/mm$^2$ at a temperature of 1000° C. to 1300° C.

3. The process according to claim 1, wherein the germanium powder is mixed with an organic liquid prior to introduction between the fitting surfaces.

4. The process of claim 3, wherein the organic liquid is highly pure water.

5. The process of claim 4, wherein the organic liquid is an organic oil.

6. The process according to claim 1, wherein flushing of the connected device parts is carried out with argon after soldering.

* * * * *